United States Patent
Forrester et al.

(10) Patent No.: US 9,244,260 B2
(45) Date of Patent: Jan. 26, 2016

(54) LIGHT CONCENTRATOR STRUCTURES AND METHODS

(71) Applicant: LITRICITY, LLC, Reno, NV (US)

(72) Inventors: Thomas C. Forrester, Bel Air, CA (US); Robert S. Block, Reno, NV (US)

(73) Assignee: LITRICITY, LLC, Reno, NV (US)

( * ) Notice: Subject to any disclaimer, the term of this patent is extended or adjusted under 35 U.S.C. 154(b) by 2 days.

(21) Appl. No.: 14/211,589

(22) Filed: Mar. 14, 2014

(65) Prior Publication Data

US 2015/0053254 A1    Feb. 26, 2015

Related U.S. Application Data

(62) Division of application No. 13/461,436, filed on May 1, 2012, now Pat. No. 8,696,147, which is a division of application No. 12/292,014, filed on Nov. 10, 2008, now Pat. No. 8,210,165.

(60) Provisional application No. 60/996,272, filed on Nov. 8, 2007.

(51) Int. Cl.
| | |
|---|---|
| *G02B 5/10* | (2006.01) |
| *G02B 19/00* | (2006.01) |
| *F24J 2/08* | (2006.01) |
| *F24J 2/46* | (2006.01) |
| *G02B 27/09* | (2006.01) |
| *H01L 31/054* | (2014.01) |
| *G02B 5/32* | (2006.01) |

(Continued)

(52) U.S. Cl.
CPC ............. *G02B 19/0004* (2013.01); *F24J 2/085* (2013.01); *F24J 2/4623* (2013.01); *G02B 5/32* (2013.01); *G02B 7/008* (2013.01); *G02B 19/0014* (2013.01); *G02B 19/0019* (2013.01); *G02B 19/0042* (2013.01); *G02B 26/02* (2013.01); *G02B 27/0927* (2013.01); *G02B 27/0944* (2013.01); *H01L 31/0522* (2013.01); *H01L 31/0543* (2014.12); *H01L 31/0547* (2014.12); *Y02E 10/43* (2013.01); *Y02E 10/52* (2013.01)

(58) Field of Classification Search
CPC ...... G02B 17/08; G02B 5/10; G02B 19/0042; G02B 5/1876; G02B 19/0028; G02B 19/0076; G02B 3/02; G02B 6/0038; F24J 2/06; F24J 2/08; F24J 2/10; F24J 2/12
USPC .................... 126/702, 683; 337/317; 359/853
See application file for complete search history.

(56) References Cited

U.S. PATENT DOCUMENTS

| | | |
|---|---|---|
| 4,112,918 A | 9/1978 | Palkes |
| 4,153,474 A | 5/1979 | Rex |

(Continued)

OTHER PUBLICATIONS

B. Johnson, "Holography Offers Eye-Safe IR Networking", Photonics Spectra, Jun. 2003, printed from photonics.com.

(Continued)

*Primary Examiner* — Euncha Cherry
(74) *Attorney, Agent, or Firm* — Buchanan Ingersoll & Rooney PC

(57) ABSTRACT

An arrangement utilizes diffractive, reflective and/or refractive optical elements combined to intensify and homogenize electromagnetic energy, such as natural sunlight in the terrestrial environment, for purposes such as irradiating a target area with concentrated homogenized energy. A heat activated safety mechanism is also described.

20 Claims, 5 Drawing Sheets

(51) Int. Cl.
*G02B 7/00* (2006.01)
*G02B 26/02* (2006.01)
*H01L 31/052* (2014.01)

(56) References Cited

U.S. PATENT DOCUMENTS

| | | | |
|---|---|---|---|
| 4,171,695 | A | 10/1979 | Sletten |
| 4,220,137 | A | 9/1980 | Tesch et al. |
| 4,297,000 | A | 10/1981 | Fries |
| 4,409,963 | A | 10/1983 | Mori |
| 4,432,609 | A | 2/1984 | Dueker et al. |
| 4,832,002 | A | 5/1989 | Medina |
| 4,863,224 | A | 9/1989 | Afian et al. |
| 4,914,908 | A | 4/1990 | Sugiyama et al. |
| 5,206,499 | A | 4/1993 | Mantravadi et al. |
| 5,325,844 | A | 7/1994 | Rogers et al. |
| 5,877,874 | A | 3/1999 | Rosenberg |
| 5,907,442 | A | 5/1999 | Matsuda |
| 6,025,583 | A | 2/2000 | Whitehead |
| 6,274,860 | B1 | 8/2001 | Rosenberg |
| 6,274,880 | B1 | 8/2001 | Walker |
| 6,299,317 | B1 | 10/2001 | Gorthala |
| 6,384,320 | B1 | 5/2002 | Chen |
| 6,418,267 | B1 | 7/2002 | Lowry |
| 6,469,241 | B1 | 10/2002 | Penn |
| 6,700,055 | B2 * | 3/2004 | Barone ............ F24J 2/085 126/683 |
| 6,920,711 | B2 | 7/2005 | Miller et al. |
| 6,945,660 | B2 | 9/2005 | Arcos Gomar et al. |
| 7,559,672 | B1 | 7/2009 | Parkyn et al. |
| 2004/0194820 | A1 | 10/2004 | Barone |
| 2006/0041089 | A1 | 2/2006 | Mather et al. |
| 2006/0072222 | A1 | 4/2006 | Lichy |
| 2006/0191566 | A1 | 8/2006 | Schaafsma |
| 2007/0014035 | A1 | 1/2007 | Jacobson et al. |
| 2007/0277869 | A1 | 12/2007 | Shan et al. |
| 2008/0245401 | A1 | 10/2008 | Winston et al. |

OTHER PUBLICATIONS

E. Wagemann et al., "Design and Optimization of a holographic concentrator for two-color PV operation", *Smithsonian/NASA ADS Physics Abstract Service*, Oct. 1993, P. SPIE Digital Library.

J.S. Quintana, et al., "Line-focusing holographic mirrors for solar ultraviolet energy concentration", *Applied Optics*, vol. 36, Issue 16, Abstract, Optical Society of America, 1997.

P. Patel-Predd, "Holographic Solar", *Technology Review*, MIT Review, Apr. 25, 2006.

* cited by examiner

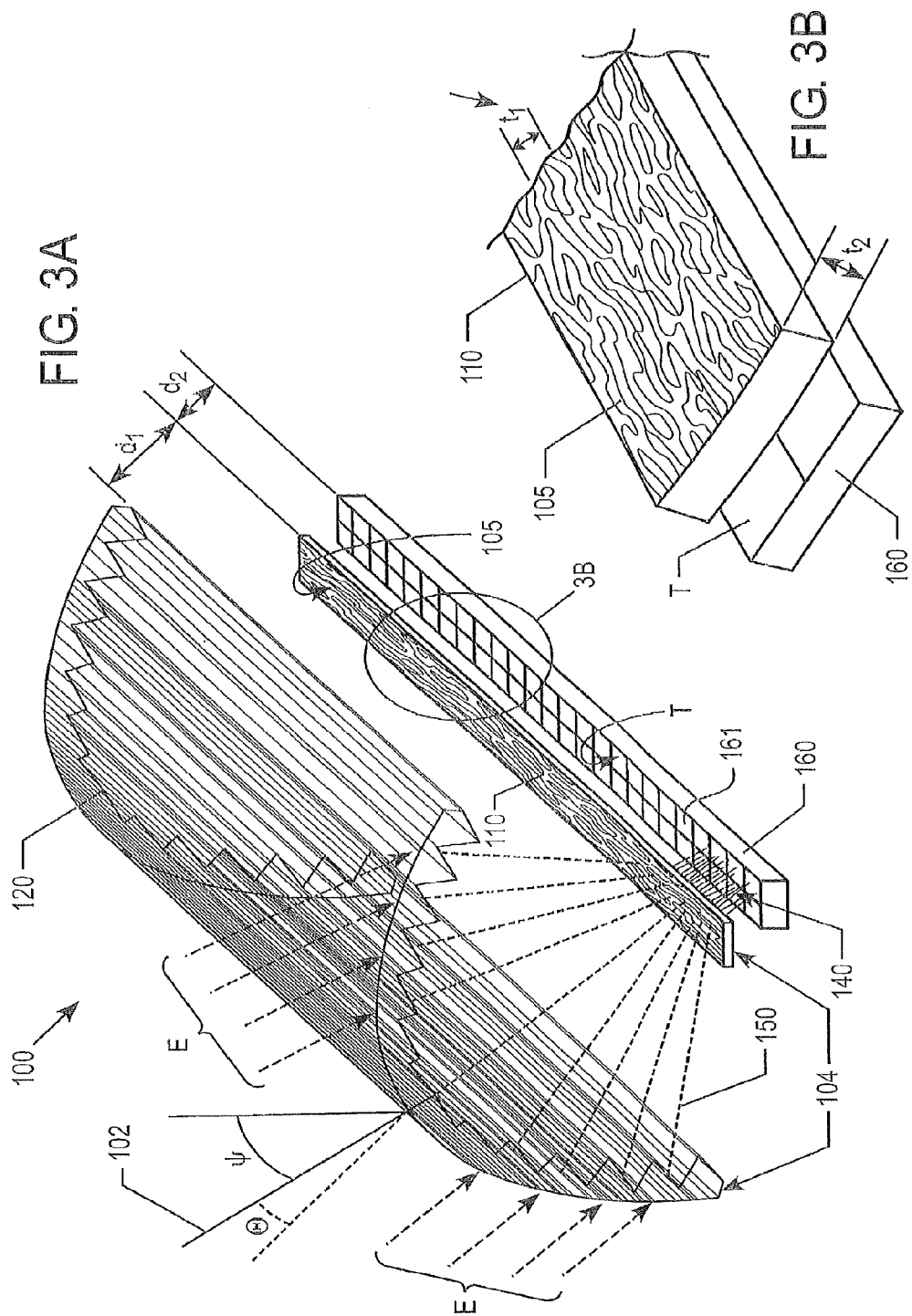

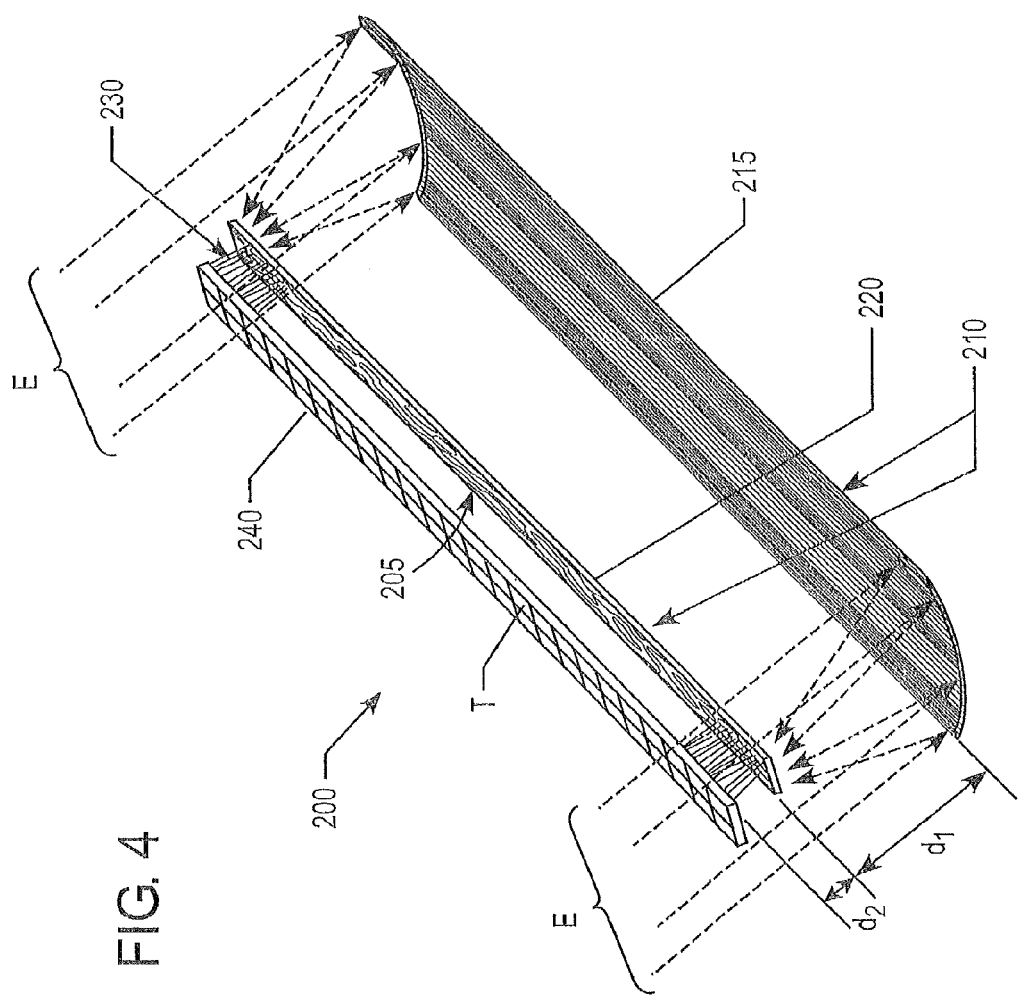

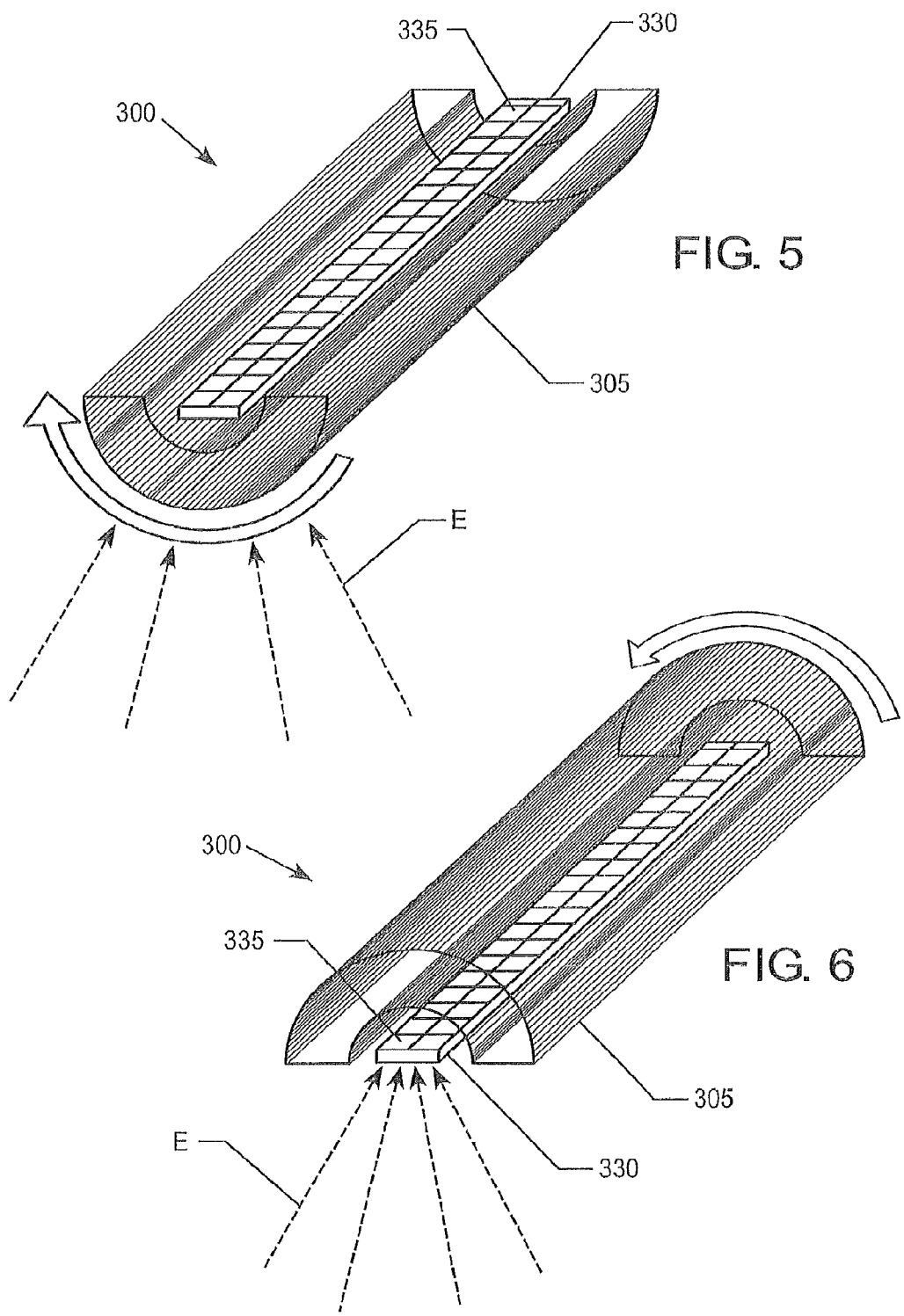

LIGHT CONCENTRATOR STRUCTURES AND METHODS

RELATED APPLICATIONS

This application is a continuation of U.S. application Ser. No. 13/461,436, filed on May 1, 2012, which is a continuation of U.S. application Ser. No. 12/292,014, filed on Nov. 10, 2008, now U.S. Pat. No. 8,210,165. This application also claims the benefit of, pursuant to 35 USC §119(e), U.S. Provisional Patent Application No. 60/996,272, filed on Nov. 8, 2007. The entire contents of these prior applications and patents are incorporated herein by reference.

FIELD

The present disclosure is in the field of optics. Also, the present disclosure is in the field of optical structures and techniques useful in the concentration of electromagnetic energy, such as sunlight.

BACKGROUND

In this specification where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

Sunlight concentrators may include optical systems which possess entrance apertures larger than their exit apertures designed to concentrate sunlight onto a target area smaller than that of the entrance aperture area. The "aperture," a term of art, refers to the effective area that gathers or collects incident energy or sunlight, and the effective area that receives concentrated energy or sunlight thereon. The ratio of the area of the entrance aperture, $A_a$, to the area of the target aperture $A_t$, defines the system's geometric concentration ratio, $C_g$, i.e., $C_g = A_a/A_t$. Historically, sunlight concentrators have been realized using geometric optical elements having feature sizes much greater than the wavelength of light and operate under the principles of geometric or ray optics. These optical elements are either reflective or refractive in nature.

Reflective sunlight concentrators are typically formed from mirrors having curved surfaces (e.g., spherically curved or parabolically curved), such as the one-stage, three-dimensional (i.e., point focus) coaxial elliptic parabolic concentrator, which consists of a mirror formed in the shape of a paraboloid of revolution, i.e., the curvature of the mirror is described by $(x/a)^2 + (y/b)^2 - z = 0$; where $a = b$, or the two-dimensional (i.e., line-focus) coaxial parabolic linear concentrator, which consists of a mirror which has the shape of a two-dimensional cross-section of a paraboloid of revolution, cut along the z axis and extruded longitudinally to form a trough. Arrays of planar, i.e., flat mirrors are sometimes used to approximate curved mirrors.

Refractive concentrators generally rely upon spherical or aspherical lenses or approximations thereof. As shown in FIGS. 1-2A, these lenses are either conventional curved lenses 10, or stepped or Fresnel lenses 20. These lenses are used to focus or concentrate sunlight 30 to either a point or a line. Conventional lenses consist of a solid, optically transparent medium with an index of refraction greater than that of air (i.e., n>1.0003). Typically, materials such as fused silica glass (n=1.459) or polycarbonate plastic, such as Lexan (n=1.586) are utilized. Stepped or Fresnel lenses have a reduced thickness compared to that of a conventional lens. In traditional imaging Fresnel lenses 20 the reduction in thickness is achieved by dividing the surface of a standard lens, which is continuous, into a set of discontinuous prismatic surfaces, each of which has the same curvature as the segment of the conventional lens surface it approximates. Stepped or Fresnel lenses are typically fabricated using the same materials as conventional lenses.

Curved mirrors, arrays of planar mirrors which are used to approximate a curved mirror, and lenses operate by way of geometric optical principles. Curved mirrors have a focal length, f, which depends upon the radius of curvature of their surfaces, typically f is of one-half of the radius of curvature. Arrays of planar mirrors have an effective focal length which depends upon the radius of the virtual curve formed by their physical placement relative to one another. Conventional lenses have a focal length dependent upon the radius of curvature of their entrance and exit surfaces, the refractive index n of the lens material, and the physical thickness of the lens material.

In addition, concentrated solar energy impinging upon solar arrays, such as arrays of photovoltaic cells, can cause catastrophic and irreversible damage to the cells due to overheating should the requisite array cooling system fail.

SUMMARY

According to certain aspects, the present disclosure provides structures, arrangements and techniques that address one or more of the abovementioned issues possessed by conventional concentrators and arrays.

Thus, according to one aspect, the present disclosure provides an arrangement for concentrating incident electromagnetic energy into a highly eccentric ellipse which approximates a line, the arrangement comprising: at least one optical member comprising: a refractive member or a reflective member; at least one diffractive member, the diffractive member comprising a plurality of diffractive elements, the diffractive elements constructed and arranged to diffract and homogenize incident electromagnetic energy.

According to another aspect, the present disclosure provides an arrangement comprising: at least one member adapted to receive electromagnetic energy incident thereon during normal operational temperatures; and a heat activated safety mechanism, the mechanism configured and arranged to remove the at least one member from the path of the incident electromagnetic energy or to block the electromagnetic energy from reaching the at least one member, upon reaching a predetermined maximum temperature.

BRIEF DESCRIPTION OF THE DRAWINGS

FIG. 3A is a perspective schematic illustration of an exemplary arrangement formed according to one aspect of the present disclosure.

FIG. 3B is a close-up partial perspective schematic view of area 3B of FIG. 3A.

FIG. 4 is a perspective schematic illustration of an exemplary arrangement formed according to a further aspect of the present disclosure.

FIG. 5 is a schematic illustration of a safety mechanism constructed according to one aspect of the present disclosure, shown in a closed or shut-down state.

FIG. 6 is a schematic illustration of the safety mechanism of FIG. 5, shown in an open or operational state.

DETAILED DESCRIPTION

Figure 1:
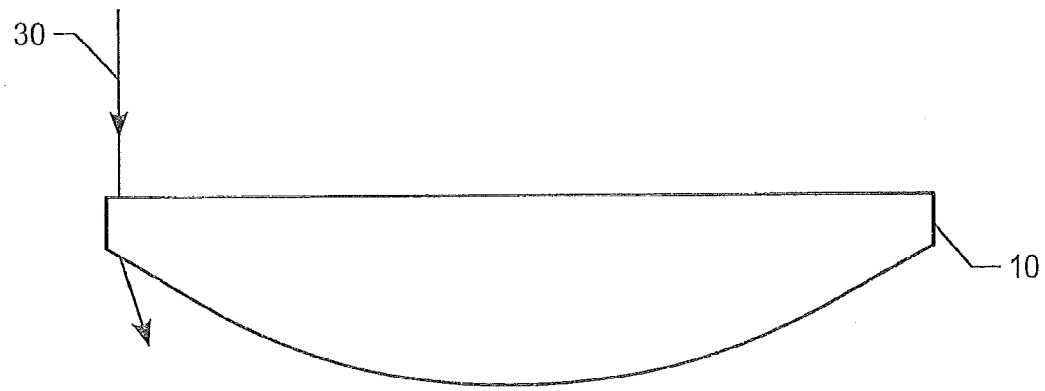
FIG. 1 is a sectional view of a conventionally constructed curved optical element.

According to certain embodiments, the present disclosure comprises a two-dimensional, or line-focusing, electromagnetic energy concentrator of the non-imaging type that is realized utilizing diffractive elements, diffractive and reflective optical elements, diffractive and refractive optical elements, or a combination of diffractive, reflective, and refractive optical elements. One possible use of these arrangements is to collect ambient natural sunlight (i.e., 1 sun concentration level) found in the terrestrial environment and intensify or "concentrate" said natural sunlight to very high intensities or a $C_g$ value on the order of 20 to 200, or even higher. As used herein, "on the order of" means having the same level of magnitude or same power of 10. Thus, according further aspects, the present disclosure is constructed to intensify or concentrate sunlight to intensities or a $C_g$ value of about 20 to 200. Arrangements of the present disclosure providing the above-mentioned concentration or intensity levels can be utilized in conjunction with, for example, one-axis azimuthal or two axis polar sun tracking arrangements.

This concentrated sunlight can then be used to irradiate photovoltaic cells for the purpose of producing electricity. Alternatively, the concentrated sunlight can be used to irradiate a passive absorber designed to capture a broad electromagnetic spectrum, from the ultraviolet to the far infrared. Such captured energy can be used for a variety of purposes, such as heating or superheating water for use in conjunction with an electrolyzer to produce hydrogen gas, heating or superheating water or another working fluid, such as oil, for the purpose of indirectly producing electricity, heating water for direct usage or consumption, or for producing electricity directly by any of a variety of thermoelectric conversion techniques, amongst others.

In an alternate embodiment, the present disclosure can also be used to concentrate sunlight to low concentrations or a $C_g$ value on the order of <20, for example a $C_g$ value on the order of 2.0. According further aspects of the present disclosure, arrangements can be constructed to concentrate sunlight to low concentrations or a $C_g$ value of about <20, for example a $C_g$ value of about 2.0. Arrangements which produce these relatively lower sunlight concentration levels typically lack a complex and/or costly tracking system. Thus, such arrangements formed according to the principles of the present disclosure may be more suitable for use in direct consumer applications, such as solar arrays intended for home installation.

The present disclosure may utilize diffractive formations or elements, as well as diffractive members comprising such formations or elements, specifically analog holographic light shaping surface diffusers, digital (i.e., computer generated) holograms, and/or kinoforms, to shape the light falling on the earth's surface into a homogenized ellipse of high eccentricity approximating a line. Historically, sunlight concentrators, or solar concentrators as they are sometimes called, have relied only upon reflective optical elements such as mirrors, or refractive optical elements such as lenses, to perform the concentration task.

Surface diffusers and digital holograms/kinoforms, which can be generally characterized as examples of diffractive members, can have diffractive formation or element sizes on the order of the wavelength of light, and operate under the principles of physical or wave optics as non-imaging optical elements. These diffractive formations or elements (e.g., 105) typically have a thickness $t_1$ on the order of 20 µm or less. Alternatively, the diffractive formations or elements can have a thickness $t_1$ of about 20 µm or less. The rapid shaping of the incoming sunlight occurs over a distance which is on the order of magnitude of the wavelength of the incoming sunlight by the process of diffraction. By contrast, the bending or shaping of incident sunlight through a refractive lens occurs over a distance that is typically millimeters, centimeters, or even decimeters, this distance corresponding to three, four, or even five orders of magnitude greater thickness of the optical element. This reduced bulk of the diffractive elements means that the diffractive element is not only much thinner, but lighter in weight and less expensive to produce, as it can be made as an "optical film" with high-speed, low-cost roll-to-roll manufacturing techniques. Such diffractive members can be formed from any suitable material. For purposes of illustration only, suitable materials may include polycarbonate, polyethylene, acrylic (i.e., polymethylmethacrylate (PMMA)), silicone, or glass. The diffractive member (e.g., 110) comprising the above described a diffractive formations or elements can have any suitable thickness $t_2$. For example, the diffractive member can have a thickness $t_2$ on the order of 250 µm, or less. Alternatively, a diffractive member of the present disclosure can have a thickness $t_2$ of about 250 µm.

In addition to these desirable properties, the sunlight concentrator arrangements that comprise the present disclosure are capable of collecting diffuse, or indirect, incident sunlight. Existing imaging type sunlight concentrators require normal or near-normal incidence, (i.e., direct), sunlight in order to operate, as they produce a tiny, sometimes elongated, image of the sun at their output target area. Sunlight that enters such an imaging optical system that is even few tenths of a degree off-axis from normal incidence will not be imaged (focused) at the target plane, and hence not be "concentrated" in any usable form. The present disclosure which is based on non-imaging-type optics, is capable of accepting diffuse sunlight up to many tens of degrees off-axis from normal and redirecting said sunlight forward through the optical system in a manner such that such off-axis sunlight can be collected, concentrated and homogenized in useful form.

As used herein, the term "homogenized" or "homogenization" is used consistent with its plain and ordinary meaning in the context of the field of optics. Thus, homogenization refers to the reduction or elimination of large variations in intensity and wavelength of energy or light before it reaches a target area. This aspect of the present disclosure provides certain distinct advantages and benefits. Arrangements constructed according to the principles of the present disclosure described herein, which feature such homogenization, may advantageously eliminate "hotspots" which reduce the efficiency of photovoltaic elements to which the concentrated light or energy may be directed. Through homogenization, the light or energy striking a target area or photovoltaic elements is more uniform in intensity, and correction of aberrations such as the "rainbow effect," which occurs because individual wavelengths of light are refracted slightly differently by an optical element, is also eliminated or at least ameliorated, thereby improving the efficiency of photovoltaic elements upon which the concentrated energy or light may be directed.

Another advantage of the present disclosure is that of preventing shadows which partially shade the input of a sunlight concentrator unit from severely impacting the output of the concentrator unit. This is accomplished by the diffractive optical element effectively weakening the shadow of a sunlight occluding opaque (or substantially opaque) object, such as a bird or leaf. This "weakening the shadow" effect occurs because the light incident on sections of the diffractive optical element adjacent to those which are occluded by the shadow is diffused, or spread, to areas on a target that would otherwise be completely shaded due to the presence of a strong shadow. Thus, although the total amount of concentrated sunlight reaching the target area is reduced, there will not be a strong shadow which completely blocks sunlight from reaching a segment of the target area.

One embodiment of the present disclosure is illustrated in FIGS. 3A-3B. The arrangement 100 comprises a two-dimensional or two-stage concentrator 104. The two-stage concentrator 104 comprises a diffractive member 110 and a refractive optical member 120. Electromagnetic energy E arrives at the refractive optical member 120 possibly at angles which vary significantly from normal or direct incidence. Such angles are illustrated, for example, in FIG. 3A as $\phi$ and $\psi$. The angle $\phi$ is the cross-sectional acceptance half angle, in other words the half angle or range of half angles at which incident light or electromagnetic energy can be received into the entrance aperture of the concentrator 104. The angle $\psi$ Is the perpendicular acceptance half-angle, in other words the half angle or range of half angles at which incident light or electromagnetic energy can be received into the entrance aperture of the concentrator 104 as measured along the length of the refractive optical element 120, and which is 90° or perpendicular to the cross-sectional acceptance half angle. According to the present disclosure, the arrangement 100 can be constructed so as to provide the concentrator 104 with any suitable range of acceptance angles $\phi$ and $\psi$. According to certain illustrated embodiments, $\phi$ can be about 0-25° (up to +/−25°), and $\psi$ can be about to 0-35° (up to +/−35°). This also allows the concentrator 104 to continue to operate under ambient conditions other than completely clear skies. Additionally, concentrator 104 does not have to precisely track the apparent motion of the sun across the sky, in fact, at low concentration ratios (e.g., $C_g$<20) the concentrator 104 can remain in a fixed location, thus avoiding the necessity of a complex and/or expensive tracking mechanism or system.

The diffractive member 110 may comprise an optically clear substrate upon which microscopic diffractive elements 105 reside. These microscopic diffractive formations or elements 105, which are holographically recorded, imprinted, embossed, cast, etched, or otherwise affixed to the substrate serve to diffract the incoming energy E in a controlled fashion such that the incoming sunlight is concentrated into an elliptical beam 140 (the entire length of which is not shown).

The diffractive elements 105 can take any suitable form, and are not limited to the schematically-illustrated configuration shown. Thus, the diffractive elements 105 can take the form of random non-periodic structures, which may or may not be generally oriented in a preferred direction. Such diffractive elements can be computer generated in a manner familiar to those in the art. See, e.g., Brent D. Johnson, "Holography Offers Eye-Safe IR Networking," Photonics.com, June 2003 (http://www.photonics.com/content/spectra/2003/June/applications/65754.aspx), which is incorporated herein by reference.

Figure 2A:
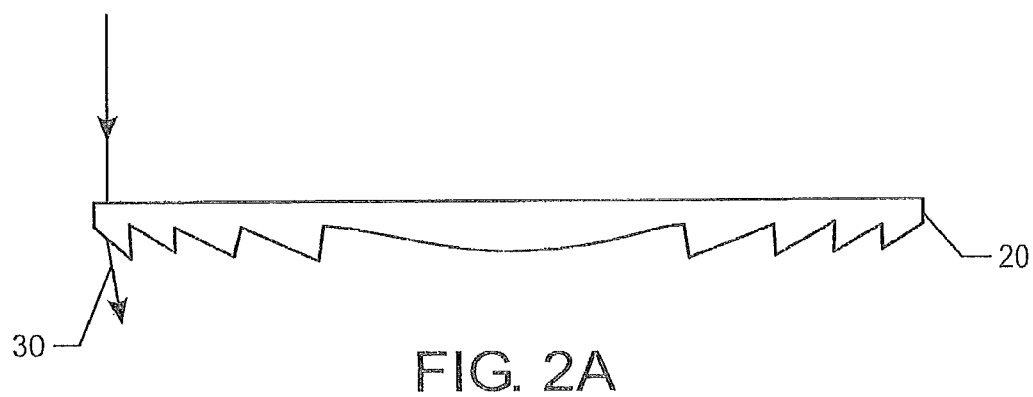
FIG. 2A is a sectional view of a conventionally constructed Fresnel optical element.
Figure 2B:
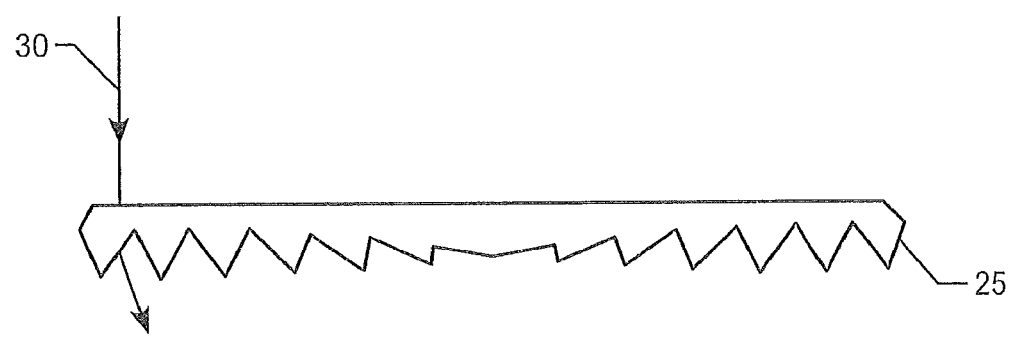
FIG. 2B is a sectional view of a non-imaging Fresnel lens or optical element which can be utilized in conjunction with an arrangement constructed according to certain aspects of the present disclosure.

According to the illustrated embodiment, the refractive optical member 120 may comprise a shaped non-imaging Fresnel lens. Any suitable refractive member can be utilized. Thus, for example, a non-imaging curved version of a Fresnel lens 25 illustrated in FIG. 2B represents one illustrative example of a suitable refractive member 120.

The refractive optical member 120 may be located at a predetermined distance $d_1$ from the diffractive member 110, nominally on the order of 50 cm. According to alternative aspects, the distance $d_1$ can be about 50 cm. The diffractive optical member 110 serves to further homogenize the energy 150 into an evenly dispersed elliptical beam 140, approximating a line, which irradiates a target area T with highly concentrated energy. An array 160, such as a solar array, may be present at the target area T. The array 160 may comprise one or more photovoltaic cells or passive optical absorbers 161 that collect the concentrated energy for useful purposes, such as the production of electricity and/or hot water. The diffractive member 110 can be placed at a suitable working distance $d_2$ from the target area or array 160. According to certain assets of the present disclosure, the working distance $d_2$ is such that the target area T or array 160 is in the "far field" of the diffractive member 110. Thus, according to illustrative examples, the working distance $d_2$ is on the order of 1 cm. According to certain additional aspects, the working distance $d_2$ is about 1 cm.

Another embodiment of the present disclosure is illustrated in FIG. 4. The arrangement 200 illustrated therein comprises a two-dimensional or two-stage concentrator/homogenizer 210. The concentrator 210 comprises a first reflective member 215 and a second diffractive member 220. The reflective member 215 can be in the form of a solid parabolic reflector formed from a single mirror with a radius of curvature comprising either an imaging paraboloid or a non-imaging compound paraboloid. Alternatively, the reflective member 215 can be in the form of a discretized virtual parabolic reflector formed from segments of substantially flat or partially curved mirror segments approximating a solid parabolic reflector (not shown). The reflective member 215 concentrates incident energy E which is then propagated onto the diffractive member 220. The diffractive member 220 can comprise an optically clear substrate upon which microscopic diffractive elements 205 reside. These diffractive formations are elements 205, which can be holographically recorded, imprinted, embossed, cast, etched, or otherwise affixed to the substrate, serve to diffract and homogenize the incoming energy E in a controlled fashion such that the incoming energy E is further modified into a substantially elliptical beam 230 (the entire length of which is not shown) approximating a line, which irradiates the target area T. An array 240, such as a solar array, can be located at the target area T and irradiated with highly concentrated sunlight. The array 240 may comprise one or more photovoltaic cells or passive optical absorbers that collect the concentrated energy for useful purposes, such as the production of electricity or hot water. Diffractive members comprising the above-mentioned diffractive formations or elements can be utilized in conjunction with the arrangements of the present disclosure, as previously described herein. Thus, the structure, configuration and dimensions of both the diffractive formations are elements 205 and diffractive member 220 can be the same as that of the previously described embodiments (e.g., 105, 110). Similarly, the diffractive formations or elements 205 and the diffractive member 220 can be formed from any suitable material, such as the materials previously described herein.

While the present disclosure may be described above, and later herein, in the context of the concentration of solar energy, the present disclosure is not so limited. Namely, the principles of the present disclosure described herein may be utilized in the context of any form of electromagnetic energy. Similarly, the present disclosure is not limited to application of the concentrated energy in the context of photovoltaic devices. Concentrated energy produced according to the principles of the present disclosure may find numerous uses other than in association with photovoltaic, solar energy, solar heating devices (e.g., water or air heaters), and/or cooling devices (e.g., air conditioning or refrigeration). For example, with appropriate adjustments in feature dimensions and form factor to accommodate other parts of the electromagnetic spectrum, the present disclosure may be used to concentrate radio-frequency (RF) energy for use as a high-gain antenna which can recover very weak signals by concentrating RF energy arriving from many directions in order to provide a larger (i.e., concentrated) RF signal to a receiver attached to the concentrator-antenna comprising an embodiment of the present disclosure optimized for the appropriate segment of the electromagnetic spectrum under consideration.

According to further aspects of the present disclosure, a novel, heat-activated safety mechanism is provided. An embodiment of such a mechanism 300 is shown in FIGS. 5 (closed/shutdown state) and 6 (open/operational state).

According to the illustrated embodiment, the mechanism 300 may comprise a heat-activated spring-like and/or lever-like mechanism comprising, for example, a shape-memory material which assumes properties at high temperatures that are significantly different than its properties at lower temperatures for the purpose of either rapidly positioning an opaque radiation safety shutter 305 directly in the path, but out of the focal plane, of incident electromagnetic radiation E which would otherwise impinge upon a target or an array 330, such as a solar array comprising one or more photovoltaic cells or passive optical absorbers 335 thereby shielding them (FIG. 5).

Alternatively, the array 330 can be physically moved out of the path of the incident energy E so as to prevent the incident energy E from damaging the at least one cell or absorber of the array 330 in the event of a cooling system malfunction or failure, or an otherwise intolerable increase in heat or operational. This can be accomplished by any suitable mechanism or arrangement, such as by rotating or swiveling the array 330 out of the path of incident energy E.

A shape memory mechanism, which can be attached to an array 330 mounting plate, will experience temperature rise and fall along with the temperature changes to the mounting plate. If the cooling system fails, or is otherwise shut-off, and incoming energy, e.g., sunlight, exists, the mounting plate's temperature will begin to rise, possibly to dangerous levels. The shape memory material may comprise an alloy such as Nitinol, wherein the martensite to austenite phase transition temperature of the alloy is set by varying the ratio of the concentrations of the constituent elements in the alloy (e.g., nickel:titanium), or by adding dopants such as cobalt. In the context of the present disclosure, this temperature shall be set at a temperature which corresponds to the maximum safe operating temperature for the array 330. Actually, the transition temperature of the shape memory material may be slightly less than the maximum safe operating temperature to account for propagation delay of heat on its way from the exposed face of the array 330 to the shape memory mechanism. Thus, for example, the austenite start transition temperature will be set slightly lower than the maximum operating temperature seen at the array 330. According to one embodiment, the shape memory mechanism can comprise a coil spring.

According to certain embodiments, the safety shutter 305 comprises a thermal barrier composed of an opaque metallic (e.g., aluminum or steel) or opaque carbon fiber or carbon composite material on at least at a first surface, and optionally, a layer of either aerogel, sol-gel, hybrid sol-gel, open-cell carbon foam, or fiberglass or the like on at least a second surface, positioned slightly away from the a flux concentration area of the energy E, so as to block the energy E from impinging upon the array 330 when activated.

Figure 7:
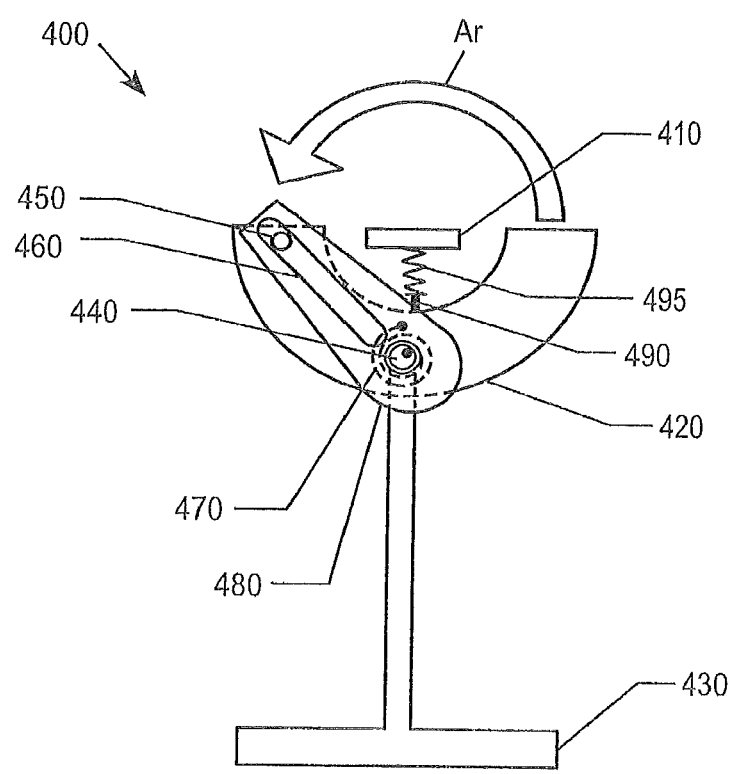
FIG. 7 is a schematic illustration of the safety mechanism formed according to an optional embodiment of the present disclosure.

One illustrative embodiment of a safety mechanism or arrangement constructed according to the present disclosure is illustrated in FIG. 7. As illustrated therein, the arrangement 400 may include a target 410 for receiving concentrated energy thereon. Any suitable target 410 can be utilized. Thus, for example, the target 410 can comprise one or more, such as an array, of photovoltaic solar elements, or passive solar/thermal absorbing elements. The target 410 is protected by a movable safety shutter or shield 420. The shutter or shield 420 can be formed from any suitable, preferably opaque material, as described above in connection with the safety mechanisms of the previously described embodiments. The shutter or shield 420 can be mounted in any suitable fashion. Thus, for example, the shutter or shield 420 can be mounted to a base or plate-like member 430. The shutter or shield 420 can be mounted as shown in the illustrative embodiment and a rotatable manner around a pivot 440. The rotational or pivoting action of the shutter or shield 420 can be accomplished, through the provision of suitable mechanical elements, such as the illustrated roller 450 and cam 460 combination. The desired rotary or movable motion of the shutter or shield 420 can be initiated through any number of suitable mechanisms. According to the illustrative embodiment, the shutter or shield 420 is normally biased in the desired rotary or pivoting direction by a suitable member such as a loading spring 470. The loading spring 470 can take any suitable form, but in the illustrative embodiment, it is shown in the forum of a linear coil spring fixed at least one end thereof. An opposing and of the loading spring 470 can be mounted to a suitable member such as a lever arm 480. Through this combination of elements, the shutter or shield 420 is normally biased in a pivoting or movable direction such that it will cover and protect the target 410 upon actuation thereof. The rotary or pivoting motion can be actuated by a number of suitable mechanisms. According to the illustrative embodiment, a retention element 490, such as the illustrated locking pin can be provided and arranged in a manner such that it normally prevents the biased movement of the shield or shutter 420. The retention element 490 can then be moved out of its locked or engage position by any suitable mechanism so as to actuate the rotary or pivoting motion of the shield 410. According to the illustrative embodiment, the retention element 490 is moved out of its locked position by a member constructed from a shape memory material 495. According to the illustrative embodiment, the member constructed from a shape memory material 495 is in the form of a spring formed from a shape memory material. Any suitable shape memory material can be utilized, such as those described in connection with the previously mentioned embodiments. Thus, upon heating of the member constructed from the shape memory material 495 to a point where it reaches a critical predetermined value that corresponds to the higher end of a safe operating temperature for the target 410, a transition in the form, shape or configuration of the member 495 takes place. This transition is then used to disengage the retention member 490 so that it no longer prevents the biased movement of the safety shield or shutter 420, for example, in the direction of arrow Ar. As discussed above in connection with the previous embodiments, this actuation of the safety shield or shutter 420 can be accomplished automatically, as described above, or manually through local or remote intentional heating of the member constructed from a shape memory material 495.

The safety mechanisms of the present disclosure may be used in combination with an electromagnetic energy concentrator structure or arrangement. According to a further embodiment, the safety mechanism of the present disclosure may be used in combination with any of the electromagnetic energy concentrator structures or arrangements described herein. Thus, for example, the safety mechanism can block a spot or a line of concentrated energy.

According to a further embodiment, the safety mechanism may comprise an automatic heat-activated, and possibly heat-operated, mechanical rotational translation mechanism which physically inverts one or more reflective, refractive or diffractive electromagnetic energy concentration members, in a manner similar to that described above for a safety shutter so as to effectively shut down the concentrator system for the purpose of protecting the array from damage in the event of cooling system failure or other over-heating scenario.

Any of the safety mechanisms of the present disclosure may also be activated manually when one wishes to 'shut-down' the concentrator system for maintenance, cleaning, upgrade or similar purpose during daylight hours, or at night in preparation for daytime inactivity, This can be accomplished, for example, by manually displacing a locking mechanism element which is ordinarily displaced by the shape memory material activator during automatic operation or by electrically heating the shape memory material so as to cause it to initiate activation of the safety shutter mechanism. The above described "manual" activation can be performed either locally or remotely.

The safety mechanisms and arrangements of the present disclosure may be used in the context of protecting devices from intolerable operational conditions caused by concentrated solar energy. However, the present disclosure is not so limited. Namely, the principles of the present disclosure described herein may be utilized in the context of any form of electromagnetic energy. Similarly, the safety mechanisms and arrangements described herein are note limited to protection of photovoltaic solar devices or passive solar absorbers.

All numbers expressing measured values, quantities, constituents, reaction conditions, physical parameters or relationships and so forth used in the specification are to be understood as being modified in all instances by the term "about." Notwithstanding that the numerical ranges and parameters set forth, the broad scope of the subject matter presented herein are approximations, the numerical values set forth are indicated as precisely as possible. Any numerical value, however, may inherently contain certain errors resulting, for example, from their respective measurement techniques, as evidenced by standard deviations associated therewith.

Although the present disclosure has been described in connection with preferred embodiments thereof, it will be appreciated by those skilled in the art that additions, deletions, modifications, and substitutions not specifically described may be made without departing from the spirit and scope of the invention.

We claim:

1. An arrangement comprising:
   at least one optical member configured to receive electromagnetic energy incident thereon during normal operational temperatures; and
   at least one diffractive member, the diffractive member comprising a plurality of diffractive elements, the diffractive elements constructed and configured to diffract and homogenize the incident electromagnetic energy, wherein the at least one diffractive member is configured to concentrate the incident electromagnetic energy into a highly eccentric ellipse which approximates a line.

2. The arrangement of claim 1, comprising:
   a heat activated safety mechanism configured and arranged to prevent the at least one optical member from being exposed to the incident electromagnetic energy upon the at least one optical member reaching a predetermined maximum temperature.

3. The arrangement of claim 2, wherein the heat activated safety mechanism is configured to remove the at least one optical member from the path of the incident electromagnetic energy or to block the electromagnetic energy from reaching the at least one optical member, upon reaching the predetermined maximum temperature.

4. The arrangement of claim 3, wherein the heat activated safety mechanism comprises a spring or lever like member formed from a shape memory material.

5. The arrangement of claim 4, wherein the shape memory material comprises a shape memory alloy, the alloy having a composition such that the martensite to austenite phase transition temperature of the alloy is commensurate with the predetermined maximum temperature.

6. The arrangement of claim 3, wherein the spring or lever like member comprises a coil spring.

7. The arrangement of claim 1, comprising:
   a movable shutter constructed and arranged for placement within the path of the incident electromagnetic energy.

8. The arrangement of claim 7, wherein the spring or lever like member causes the shutter to move into the path of the incident electromagnetic energy upon reaching the predetermined maximum temperature, thereby shielding the at least one optical member from the electromagnetic energy.

9. The arrangement of claim 7, wherein the shutter is formed, at least in part, from at least one of an opaque metallic material or an opaque carbon composite material.

10. The arrangement of claim 9, wherein the shutter is additionally formed, at least in part, from a layer of at least one of: an aerogel, sol-gel, hybrids sol-gel, open cell, carbon foam or fiberglass material.

11. The arrangement of claim 1, wherein the electromagnetic energy comprises solar energy.

12. The arrangement of claim 1, wherein the at least one optical member comprises a photovoltaic cell or a passive solar absorber.

13. The arrangement of claim 12, comprising:
   a heat activated safety mechanism configured and arranged to prevent the at least one optical member from being exposed to the incident electromagnetic energy upon the at least one optical member reaching a predetermined maximum temperature, the heat activated safety mechanism comprising a spring or lever like member formed from a shape memory material,
   a mounting plate for the photovoltaic cell or the passive solar absorber, the spring or lever like member attached to the mounting plate.

14. The arrangement of claim 3, wherein the heat activated safety mechanism causes the at least one optical member to move out of the path of the incident electromagnetic energy upon reaching the predetermined maximum temperature, to prevent the at least one optical member from direct exposure to the electromagnetic energy.

15. The arrangement of claim 3, wherein the heat activated safety mechanism is further configured and arranged to be manually activated to remove the at least one optical member from the path of the incident electromagnetic energy or blocking the electromagnetic energy from reaching the at least one optical member.

16. The arrangement of claim 1, comprising:
at least one concentrator constructed and configured to direct the electromagnetic energy such that the electromagnetic energy reaches the at least one optical member in a concentrated form.

17. The arrangement of claim 16, comprising:
a heat activated safety mechanism configured and arranged to remove the at least one optical member from the path of the incident electromagnetic energy or to block the electromagnetic energy from reaching the at least one optical member, upon reaching a predetermined maximum temperature,
wherein the heat activated safety mechanism comprises a spring or lever like member formed from a shape memory material, and
wherein the spring or lever like member causes the at least one concentrator to move out of the path of the incident electromagnetic energy upon reaching the predetermined maximum temperature, thereby preventing concentrated electromagnetic energy from reaching the least one member.

18. The arrangement of claim 16, wherein the at least one diffractive member is comprised in the concentrator.

19. The arrangement of claim 16, wherein the concentrator further comprises one or more of: a reflective member; a refractive member; and an additional diffractive member.

20. The arrangement of claim 18, wherein each of the diffractive elements comprises one or more of: analog holographic light shaping surface diffusers, digital holograms, and kinoforms.

* * * * *